(12) United States Patent
Becker

(10) Patent No.: US 6,512,361 B1
(45) Date of Patent: Jan. 28, 2003

(54) 14/42-VOLT AUTOMOTIVE CIRCUIT TESTER

(75) Inventor: Thomas P. Becker, Kenosha, WI (US)

(73) Assignee: Snap-on Technologies, Inc., Lincolnshire, IL (US)

(*) Notice: Subject to any disclaimer, the term of this patent is extended or adjusted under 35 U.S.C. 154(b) by 0 days.

(21) Appl. No.: 09/865,663

(22) Filed: May 29, 2001

(51) Int. Cl.[7] .......................... G01R 19/14; G01R 31/02
(52) U.S. Cl. ...................................... 324/133; 324/72.5
(58) Field of Search ............................... 324/133, 72.5, 324/103 P, 99 D, 149, 141; 702/63; 320/152

(56) References Cited

U.S. PATENT DOCUMENTS

| | | |
|---|---|---|
| 3,987,392 A | 10/1976 | Kugelmann et al. |
| 4,004,220 A | 1/1977 | Kerber et al. |
| 4,006,412 A | 2/1977 | Campbell et al. |
| 4,028,057 A | 6/1977 | Nelson |
| 4,296,375 A | 10/1981 | Takezaki |
| 4,301,407 A | 11/1981 | Koslar |
| 4,527,118 A | 7/1985 | Koslar |
| 4,532,472 A | 7/1985 | Ishino |
| 4,559,497 A | 12/1985 | Farrugia |
| 4,634,971 A | 1/1987 | Johnson et al. |
| 4,812,744 A | 3/1989 | Havel |
| 5,008,613 A | 4/1991 | Steinel et al. |
| 5,075,620 A | 12/1991 | Shaw |
| 5,369,416 A | 11/1994 | Haverty et al. |
| 5,412,312 A | 5/1995 | Crass et al. |
| 5,420,503 A | 5/1995 | Beha |
| 5,517,183 A | 5/1996 | Bozeman, Jr. |
| 5,617,018 A * | 4/1997 | Earle .......................... 324/539 |
| 5,939,874 A | 8/1999 | Duley |
| 6,043,641 A | 3/2000 | Singer et al. |
| 6,121,753 A | 9/2000 | Walker et al. |

FOREIGN PATENT DOCUMENTS

EP 0 402 286 A1 5/1990

\* cited by examiner

Primary Examiner—Christine Oda
Assistant Examiner—James Kerveros
(74) Attorney, Agent, or Firm—Seyfarth Shaw

(57) ABSTRACT

A circuit tester for both 14-volt and 42-volt automotive electrical systems includes a housing with a probe tip at one end and a ground connector at the other end. A battery-powered voltage detection circuit in the housing includes a plurality of comparators, each having one input connected to an input signal from the probe tip and a reference input connected to a tap of a tapped voltage divider providing plural reference signals having amplitudes respectively corresponding to industry-standard voltage levels, the comparators being arranged in two groups respectively corresponding to 14-volt and 42-volt automotive systems. Series-connected LEDs have their cathodes respectively connected to the outputs of the comparators, and are arranged for respectively being viewed through apertures in the housing arranged in two separate rows. The interconnections are such that only one LED at a time is illuminated, i.e., the one corresponding to the highest reference signal level which is equaled or exceeded by the input signals.

25 Claims, 3 Drawing Sheets

14/42-VOLT AUTOMOTIVE CIRCUIT TESTER

BACKGROUND

Automobiles and other automotive vehicles have electrical systems powered by an on-board battery for controlling the starter motor, ignition systems, lighting, other accessories and the like. For a number of years, such automotive electrical systems have typically been powered by 12-volt battery, the actual operating voltage of such systems being about 14 volts with reference to charging voltages. A number of different types of portable, hand-held circuit testers have been developed for testing such automotive electrical systems, which testers are calibrated to operate in a voltage range suitable for a nominal 14-volt system, which range typically runs from zero to about 20 VDC.

The automotive industry is presently developing a new automotive electrical system which will be capable of operating from both the traditional 12-volt power system and a proposed 36-volt power system, which will have an actual operating voltage of about 42 volts with reference to charging voltage. This will require development of circuit tester tools calibrated to the proposed 42-volt electrical systems, yet 14-volt system testers will also be needed for many years to come.

The automotive industry has established various standard voltage levels for both the 14-volt and 42-volt systems, including such voltages as minimum start voltage, minimum voltage-engine off, maximum voltage-engine off, maximum voltage clamp, as well as the nominal voltage for the system operation. Existing hand-held circuit testers are designed to simply indicate hot or ground circuits or high or low logic levels, and do not indicate plural specific voltage levels. Meters or testers are, of course, available which will measure precise voltages or multiple voltage levels, but they are typically larger and more complex devices and are not designed for hand-held probe-type use.

SUMMARY

This application discloses a circuit testing apparatus and method which avoids the disadvantages of prior circuit testers while affording additional structural and operating advantages.

An important aspect is the provision of an automotive circuit tester which can indicate plural discrete voltage levels in different voltage ranges.

Another aspect is the provision of a circuit tester of the type set forth which is of simple and economical construction.

A still further aspect is the provision of a circuit tester of the type set forth, which is capable of testing high-impedance circuits without significantly loading them.

Another aspect is the provision of a circuit tester of the type set forth, which automatically turns the tester on in the presence of an input voltage.

Certain ones of these and other aspects may be attained by providing a portable hand-held automotive circuit tester for detecting voltages in different voltage ranges corresponding respectively to different-voltage automotive electrical systems, the tester comprising: a housing having a probe tip and a ground connector projecting therefrom and having plural groups of indicator apertures therein respectively corresponding to plural different voltage ranges; and a voltage detector disposed in the housing and including an input circuit coupled to the probe tip and producing an input signal from the circuit being tested, a power supply circuit, a reference circuit coupled to the power supply circuit and producing a plurality of reference signals arranged in sets corresponding to the plural different voltage ranges with each set incrementally graduated from a low amplitude to a high amplitude, a comparison circuit coupled to the input circuit and to the reference circuit and to the power supply circuit and comparing the input signal to each of the reference signals, and plural groups of indicators respectively corresponding to the sets of reference levels and respectively viewable through the groups of apertures and coupled to the comparison circuit so that only one group of indicators will be operable, depending on the voltage of the automotive electrical system being tested, the comparison circuit being responsive to the input signal for energizing the indicator corresponding to the highest reference level which the input signal equals or exceeds.

BRIEF DESCRIPTION OF THE DRAWINGS

For the purpose of facilitating an understanding of the subject matter sought to be protected, there is illustrated in the accompanying drawings an embodiment thereof, from an inspection of which, when considered in connection with the following description, the subject matter sought to be protected, its construction and operation, and many of its advantages should be readily understood and appreciated.

DETAILED DESCRIPTION

Figure 1:
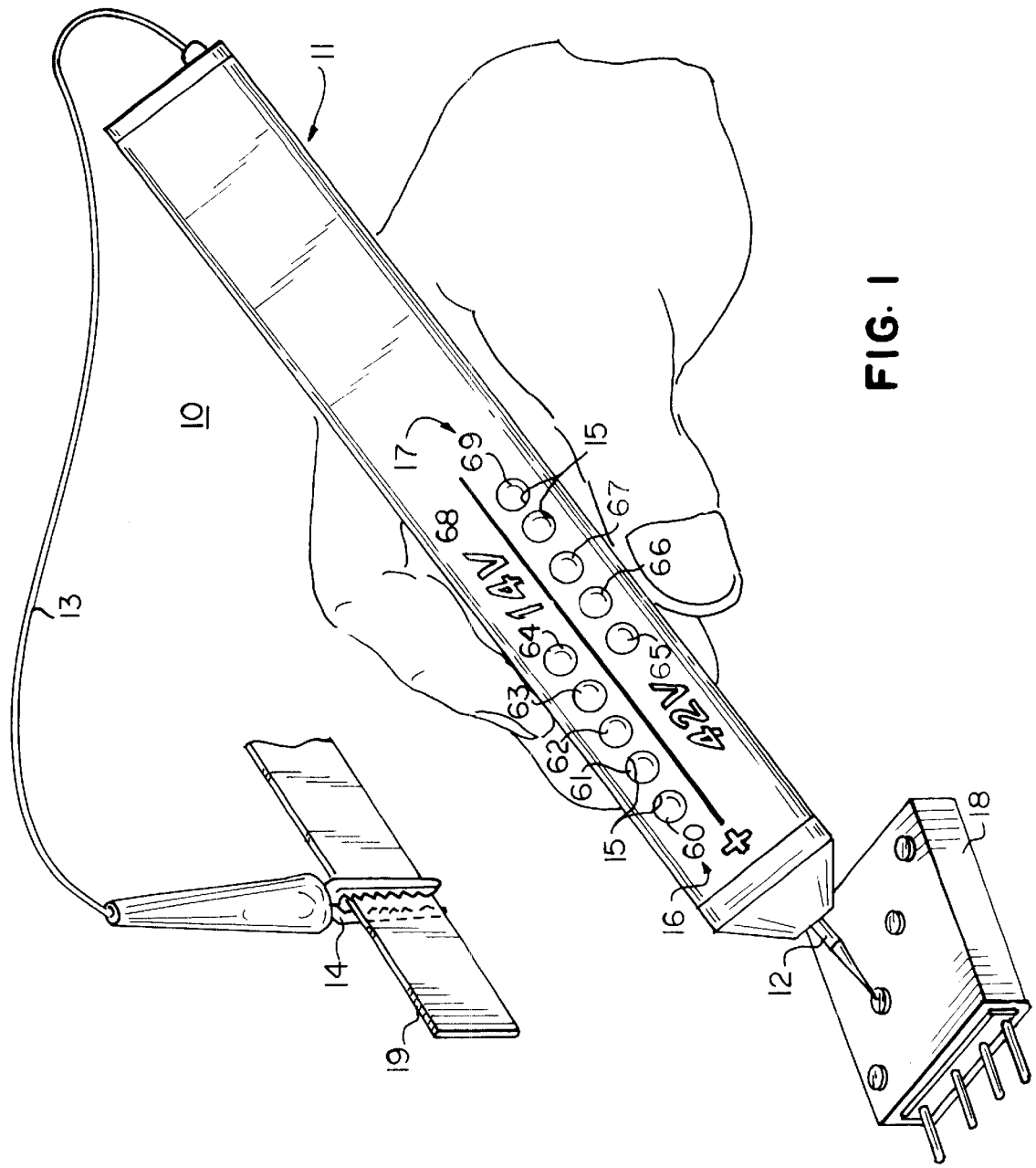
FIG. 1 is a perspective view of a circuit tester illustrating its use in testing an automotive circuit.

Referring to FIG. 1, there is illustrated a circuit tester, generally designated by the numeral 10, having an elongated housing 11, which may be generally rectangular in transverse cross section and is dimensioned to be easily held in a user's hand, as illustrated. The housing 11 is provided with a probe tip 12 at one end thereof and is provided at the other end thereof with a ground or reference wire 13 terminating in an alligator-type ground or reference clip 14. Formed in the housing 11 are a plurality of apertures 15 arranged in two straight-line rows 16 and 17, respectively corresponding to 14-volt and 42-volt automotive electrical systems. In use, the probe tip 12 is adapted to contact a test point in an associated automotive electrical circuit 18, while the ground clip 14 is clipped onto a suitable grounded part 19, in a known manner.

Figure 2:
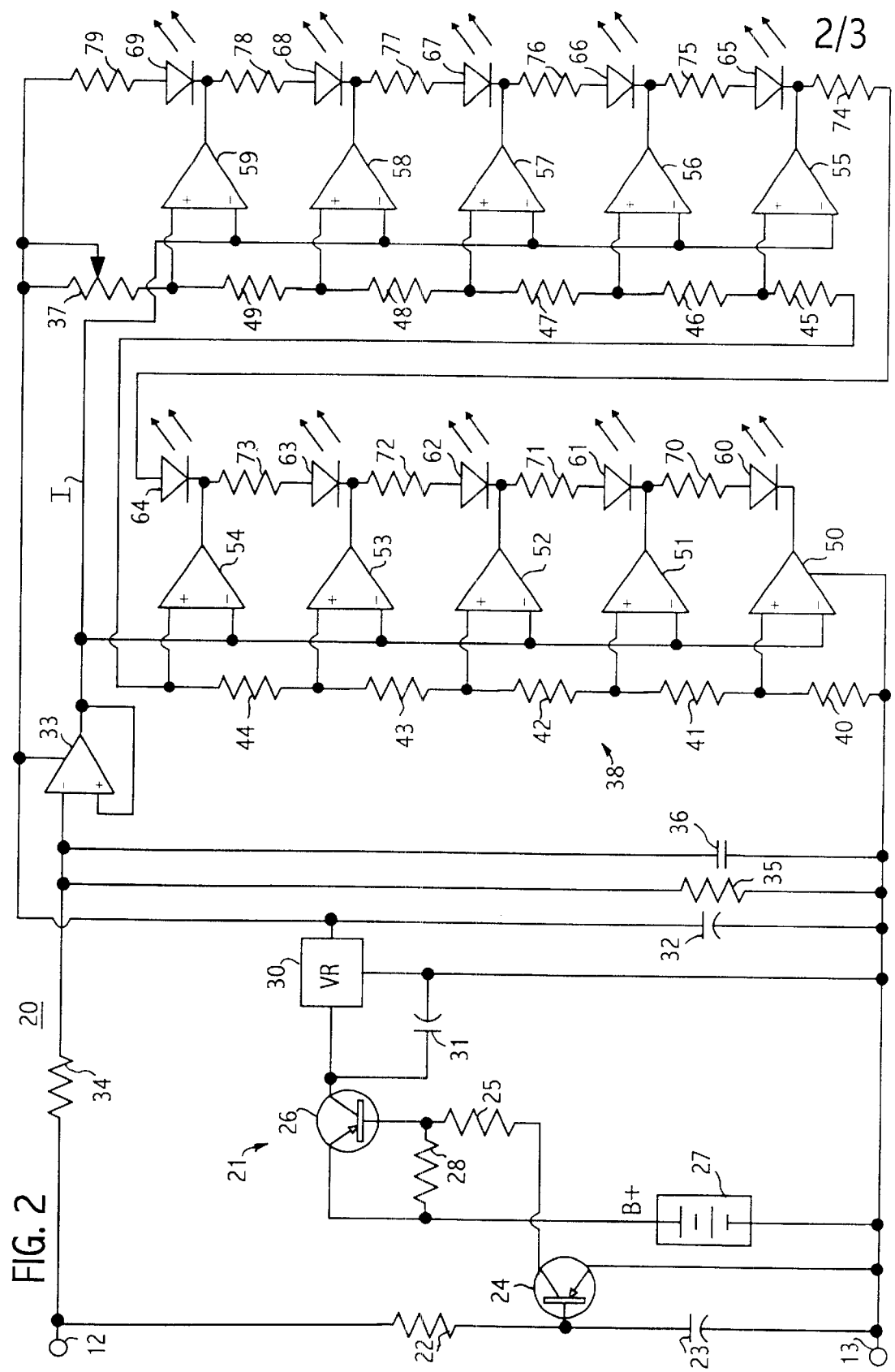
FIG. 2 is a schematic circuit diagram of the voltage detection circuitry of the tester of FIG. 1.

Referring also to FIG. 2, there is illustrated a voltage detection circuit 20 housed in the housing 11. The detection circuit 20 has an automatic-on power supply circuit 21, which includes a resistor 22 and a capacitor 23 connected in series across the probe 12 and ground wire 13, the junction therebetween being connected to the base of a transistor 24, the emitter of which is grounded and the collector of which is connected through a resistor 25 to the base of a transistor 26. The emitter of the transistor 26 is connected to the positive terminal of a battery 27, the negative terminal of which is connected to ground, a resistor 28 being connected across the base-emitter junction of the transistor 26. The collector of the transistor 26 is connected to an input terminal of a voltage regulator circuit 30, which may be a 78L05, which has a ground connection and a capacitor 31 connected across the input/ground connection junction.

In operation, the transistors 24 and 26 are normally off, so that the voltage regulator 30 is not powered and there is negligible drain on the battery 27. When the circuit tester 10 is in use, and a voltage appears between the probe tip 12 and the ground wire 13, the voltage across the resistor 22 turns on the transistor 24 which, in turn, turns on the transistor 26, through the current-limiting resistor 25 for connecting the battery 27 to the input of the voltage regulator 30, which produces at its output a regulated V+ supply voltage which may, for example, be a +5 VDC, for powering the rest of the detection circuit 20. The capacitor 23 provides noise-suppression filtering and capacitor 31 is an input filter to keep the voltage regulator 30 from oscillating. A noise-suppression filter capacitor 32 is also connected between the output of the voltage regulator 30 and ground.

The detection circuit 20 also includes an operational amplifier 33 configured as a voltage follower and having its non-inverting input connected through a resistor 34 to the probe tip 12 and through a resistor 35 to ground, and having its output connected to its inverting input. The non-inverting input of the amplifier 33 is also connected through a capacitor 36 to ground. Resistors 34 and 35 form a voltage divider to adjust the level of the probe input voltage, op amp 33 provides a low-impedance output so that the remainder of the circuitry does not load down the voltage divider, and capacitor 36 provides noise-suppression.

The V+ supply voltage is applied through a potentiometer 37 to a reference circuit including a voltage divider 38 comprised of a plurality of resistors 40–49 connected in series between the potentiometer 37 and ground for producing ten different reference voltage levels, the reference voltage levels across the resistors 40–44 respectively falling in a voltage range corresponding to a 14-volt automotive electrical system, and the reference voltage levels across the resistors 45–49 being in a range corresponding to a 42-volt automotive electrical system. Preferably, each of the reference voltage levels may correspond to an industry-established voltage level. These reference voltage levels are connected to a comparison circuit, including a plurality of integrated-circuit comparators 50–59. More specifically, the reference voltage levels across the resistors 40–49 are, respectively, connected to the non-inverting inputs of the comparators 50–59, the inverting inputs of which are all connected in parallel to an input signal I generated at the output of the voltage follower 33.

The outputs of the comparators 50–59 are connected to an indicating circuit including a plurality of series-connected diodes 60–69 alternating with resistors 70–79. More specifically, each comparator 50–59 has its output connected to the cathode of a corresponding LED, the anode of which is connected through a corresponding resistor to the cathode of the next LED in line, or in the case of the last resistor 79, to the V+ supply. It will be appreciated that each of the comparators 50–59 is connected to the V+ supply voltage in the same manner as indicated for the op amp 33 and each is connected to ground in the manner illustrated for the comparator 50, but the connections to the other comparators are omitted from FIG. 2 for simplicity.

In operation, a voltage level detected with the probe tip 12 is adjusted to the input signal I, which is applied to the comparators 50–59 for comparison with each of the reference voltage levels established by the voltage divider 38. The output of each comparator 50–59 is normally high, preventing conduction through its associated LED. It will be appreciated that the LEDs 60–69 are respectively disposed in the apertures 15 in the housing 11 for viewing by the user, the LEDs 60–64 being disposed in the 14-volt row 16 and the LEDs 65–69 being disposed in the 42-volt row 17. If the input signal I has a voltage level which equals or exceeds the reference level of any of the comparators 50–59, the output of each such comparator will go low. For example, if the input signal level is above the reference level for the comparator 52, but below the reference level for the comparator 53, the outputs of each of the comparators 50–52 will go low. The low at the output of the comparator 52 will cause its corresponding LED 62 to conduct and become illuminated, and it will short out the LEDs 60 and 61 so that they will not become illuminated, even though the outputs of their associated comparators 50 and 51 are low. Thus, only one LED at a time can be illuminated, viz., the one which corresponds to the highest reference level equaled or exceeded by the input signal I.

Figure 3:
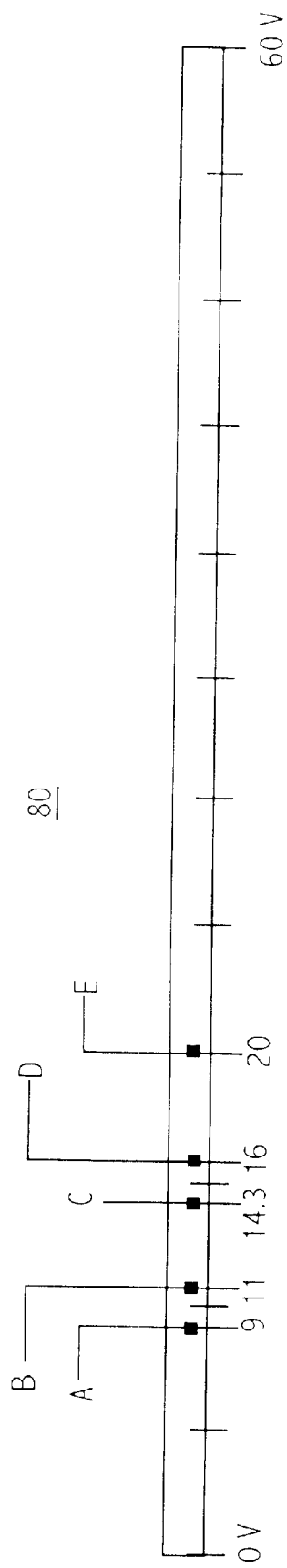
FIG. 3 is a diagrammatic illustration of the voltage levels detected by the tester of FIG. 1 in a first voltage range.
Figure 4:
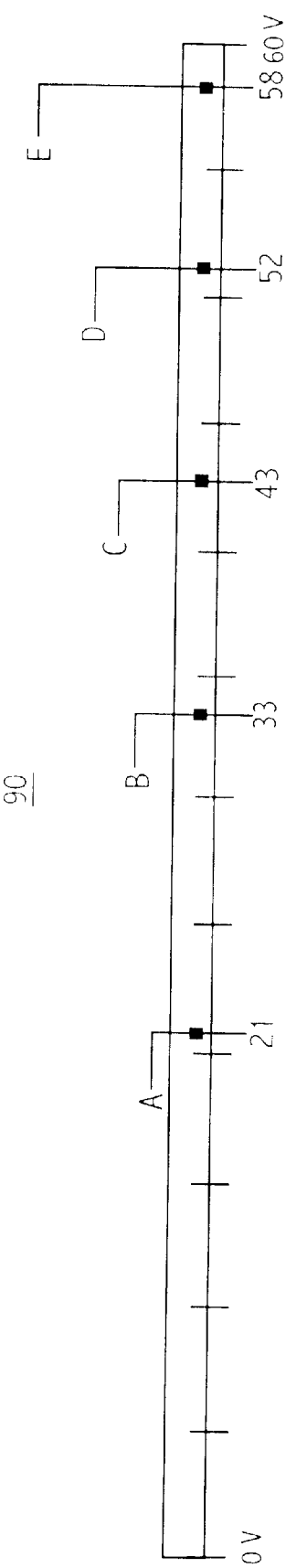
FIG. 4 is a diagram illustrating the voltage levels detected by the tester of FIG. 1 in a second voltage range.

Referring to FIGS. 3 and 4, there are illustrated graphs of the voltage ranges for the 14-volt and 42-volt automotive electrical systems, respectively. As shown in FIG. 3, the range for the 14-volt system runs from zero to about 20 volts, while that for the 42-volt system extends from about 25 volts to about 60 volts, as shown in FIG. 4, so that these ranges are non-overlapping. In each graph, voltage levels respectively designated A–E, are the industry-established voltage levels for the minimum start voltage, minimum voltage-engine off, nominal system voltage, maximum voltage-engine on and maximum voltage clamp. Preferably, the reference voltage levels set by the voltage divider 38 respectively correspond to these industry-standard voltage levels, so that the service technician can quickly and easily check them on an automotive vehicle. These voltage levels could be indicated directly on the housing 11 next to the corresponding LEDs. Also, if desired, different colored LEDs could be used. While, in the illustrated embodiment, a supply battery is provided, it will be appreciated that, if desired, the detection circuit 20 could be powered from the automotive vehicle battery or from the circuit being tested.

The matter set forth in the foregoing description and accompanying drawings is offered by way of illustration only and not as a limitation. While a particular embodiment has been shown and described, it will be apparent to those skilled in the art that changes and modifications may be made without departing from the broader aspects of applicant's contribution. The actual scope of the protection sought is intended to be defined in the following claims when viewed in their proper perspective based on the prior art.

I claim:

1. A portable hand-held automotive circuit tester for detecting voltages in different voltage ranges corresponding respectively to different-voltage automotive electrical systems, the tester comprising:

a housing having a probe tip and a ground connector projecting therefrom and having plural groups of indicator apertures therein respectively corresponding to plural different voltage ranges; and a voltage detector disposed in the housing and including
an input circuit coupled to the probe tip and producing an input signal from the circuit being tested,
a power supply circuit,
a reference circuit coupled to the power supply circuit and producing a plurality of reference signals arranged in sets corresponding to the plural different voltage ranges with each set incrementally graduated from a low amplitude to a high amplitude, a comparison circuit coupled to the input circuit and to the reference circuit and to the power supply circuit and comparing the input signal to each of the reference signals, and plural groups of indicators respectively corresponding to the sets of reference signals and respectively viewable through the groups of apertures and coupled to the comparison circuit so that only one group of indicators will be operable, depending on the voltage of the automotive electrical system being tested, the comparison circuit being responsive to the input signal for energizing the indicator corresponding to the highest reference level which the input signal equals or exceeds.

2. The tester of claim 1, wherein the housing includes two groups of indicator apertures.

3. The tester of claim 2, wherein the voltage ranges respectively correspond to 12-volt and 42-volt automotive electrical systems.

4. The tester of claim 2, wherein the indicator apertures are arranged in two separate rows.

5. The tester of claim 1, wherein the comparison circuit includes a plurality of comparators each having a reference input receiving one of the reference signals and a signal input receiving the input signal.

6. The tester of claim 1, wherein the indicators are LEDs.

7. The tester of claim 6, wherein the comparison circuit includes plurality of comparators respectively corresponding to the reference signals, the indicators including series-connected LEDs with each LED having its cathode connected to the output of a corresponding comparator, the anode of the LED connected to the comparator with the highest amplitude reference signal being connected to the power supply.

8. The tester of claim 1, wherein the indicators are coupled to the comparison circuit so that only one indicator at a time is energized.

9. The tester of claim 1, wherein the reference circuit includes a tapped voltage divider.

10. The tester of claim 1, wherein the voltage ranges are non-overlapping.

11. The tester of claim 1, wherein the power supply circuit includes a power source disposed in the housing.

12. The tester of claim 11, wherein the power supply circuit includes a circuit to maintain the battery disconnected except in the presence of an input signal.

13. A portable hand-held automotive circuit tester for detecting voltages in plural different voltage ranges corresponding respectively to plural different-voltage automotive electrical systems, the tester comprising:

input means adapted to be coupled to the circuit being tested for producing an input signal, reference means for producing a plurality of reference signals arranged in sets corresponding respectively to the plural different voltage ranges with each set incrementally graduated from a low amplitude to a high amplitude;

comparison means coupled to the input means and to the reference means for comparing the input signal to each of the reference signals, and plural groups of indicators respectively corresponding to the set of reference signals and coupled to the comparison means so that only one group of indicators will be operable depending on the voltage of the automotive electrical system being tested, the comparison means being responsive to the input signal for energizing the indicator corresponding to the highest reference level which the input signal equals or exceeds.

14. The tester of claim 13, wherein the voltage ranges respectively correspond to 12-volt and 42-volt automotive electrical systems.

15. The tester of claim 13, wherein the comparison means includes a plurality of comparators each having a reference input receiving one of the reference signals and a signal input receiving the input signal.

16. The tester of claim 13, wherein the indicators are LEDs.

17. The tester of claim 13, wherein the indicators are coupled to the comparison means so that only one indicator at a time is energized.

18. The tester of claim 13, wherein the voltage ranges are non-overlapping.

19. The tester of claim 13, wherein the reference means includes a tapped voltage divider.

20. The tester of claim 13, and further comprising a power source and means for disconnecting the power source except in the presence of an input signal.

21. A method of testing plural different-voltage automotive electrical systems comprising:

providing a single portable hand-held tester capable of detecting voltage levels in ranges associated respectively with the different-voltage automotive electrical systems and having different groups of indicators corresponding respectively to the voltage level ranges, using the tester to acquire input signals from each of the plural different-voltage automotive electrical systems, comparing each input signal with a plurality of reference voltage levels arranged in sets corresponding to the different voltage level ranges with each set incrementally graduated from a low amplitude to a high amplitude, and indicating the voltage level of each input signal by activating a corresponding indicator in the group of indicators associated with the voltage of the electrical system from which the input signal is acquired.

22. The method of claim 21, wherein the voltage ranges respectively correspond to 12-volt and 42-volt automotive electrical systems.

23. The method of claim 21, wherein only one indicator at a time is activated.

24. The method of claim 21, wherein the voltage ranges are non-overlapping.

25. The method of claim 21, and further comprising energizing the tester only in the presence of an input signal.

* * * * *